United States Patent [19]

Fraas et al.

[11] Patent Number: 5,389,158
[45] Date of Patent: * Feb. 14, 1995

[54] LOW BANDGAP PHOTOVOLTAIC CELL WITH INHERENT BYPASS DIODE

[75] Inventors: Lewis M. Fraas, Issaquah; James E. Avery, Fall City, both of Wash.

[73] Assignee: The Boeing Company, Seattle, Wash.

[*] Notice: The portion of the term of this patent subsequent to Sep. 28, 2010 has been disclaimed.

[21] Appl. No.: 97,353

[22] Filed: Jul. 26, 1993

Related U.S. Application Data

[60] Continuation-in-part of Ser. No. 840,509, Feb. 24, 1992, Pat. No. 5,248,346, which is a continuation-in-part of Ser. No. 717,635, Jun. 19, 1991, Pat. No. 5,123,968, which is a division of Ser. No. 523,710, May 14, 1990, Pat. No. 5,091,018, which is a continuation-in-part of Ser. No. 339,311, Apr. 17, 1989, abandoned, said Ser. No. 717,635, is a continuation-in-part of Ser. No. 527,061, May 21, 1990, Pat. No. 5,096,505, Ser. No. 527,038, May 21, 1990, Pat. No. 5,118,361, and Ser. No. 755,316, Sep. 5, 1991, Pat. No. 5,217,539.

[51] Int. Cl.[6] .............................................. H01L 31/05
[52] U.S. Cl. .................................... 136/244; 136/249; 136/255; 136/262; 136/293
[58] Field of Search ................... 136/244, 249 TJ, 255, 136/262, 293

[56] References Cited

U.S. PATENT DOCUMENTS

| | | | |
|---|---|---|---|
| 4,658,086 | 4/1987 | McLeod et al. | 136/249 |
| 4,746,371 | 5/1988 | McLeod et al. | 136/249 |
| 4,776,893 | 10/1988 | McLeod et al. | 136/249 |
| 5,091,018 | 2/1992 | Fraas et al. | 136/246 |
| 5,096,505 | 3/1992 | Fraas et al. | 136/246 |
| 5,118,361 | 6/1992 | Fraas et al. | 136/246 |
| 5,123,968 | 6/1992 | Fraas et al. | 136/246 |
| 5,217,539 | 6/1993 | Fraas et al. | 136/246 |
| 5,248,346 | 9/1993 | Fraas et al. | 136/244 |

OTHER PUBLICATIONS

Fraas et al., "High Efficiency GaAs/GaSb Tandem Solar Cells and Tandem Circuit Cards." Sandia Report 89-1543, Jul. 1989.

Avery et al., "Tandem Concentrator Solar Cells with 30% (AMO) Power Conversion Efficiency."

Fraas et al., "GaSb Booster Solar Cells for Over 30% Efficient Solar Cell Stacks." Journal of Applied Physics, 66(8); Oct. 15, 1989.

Fraas et al., "Tandem Solar Cells with 31% (AMO) and 37% (AMI 5.D) Energy Conversion Efficiencies." IEEE Aerospace and Electronics Systems, vol. 4, No. 11; Nov. 1989, pp. 3–9.

Fraas et al., "High Efficiency GaAs/GaSb Tandem Solar Cells and Tandem Circuit Cards." IEEE, 1989, Document No. CH2781-3/89/0000-0815, pp. 815–820.

Sundaram et al., "GaAs Solar Cell Using an Alternative Arsenic Source." Material Research Society Symposium Proceedings, vol. 145, 1989, pp. 211–215.

Fraas et al., "Vacuum Chemical Epitaxy: High Throughput GaAs Epitaxy Without Arsine." Interior Research Society Symposium Proceedings, vol. 145, 1989, pp. 253–258.

Sundaram et al., "Tertiary Butylarsine Grown GaAs Solar Cell." Applied Physics Letters, vol. 54, No. 7, 13 Feb. 1989, pp. 671–673.

Fraas et al., "Over 35% Efficient GaAs/GaSb Tandem Solar Cells." IEEE Transactions in Electron Devices, Feb. 1990.

Fraas et al., "Tandem Gallium Solar Cell Voltage–Matched Circuit Performance Projections," Solar Cells, 30 (1991) 355–361.

*Primary Examiner*—Aaron Weisstuch
*Attorney, Agent, or Firm*—John C. Hammar

[57] ABSTRACT

A photovoltaic (PV) cell with a single pn-junction is disclosed that is capable of functioning as both a current source and a bypass diode. The photovoltaic cell is made of material that has a low bandgap energy, 1.0 eV, or less. One version of the PV cell is formed of a GaSb wafer doped with Te to form an n-region; the Te concentration is between 6 and $10 \times 10^{17}$ atoms/cm$^3$. Multiple PV cells of this invention can be connected in series or in parallel or in tandem in a primary-booster tandem pair to form a circuit without the requirement of protecting the individual cells of the circuit with a separate bypass diode.

4 Claims, 4 Drawing Sheets

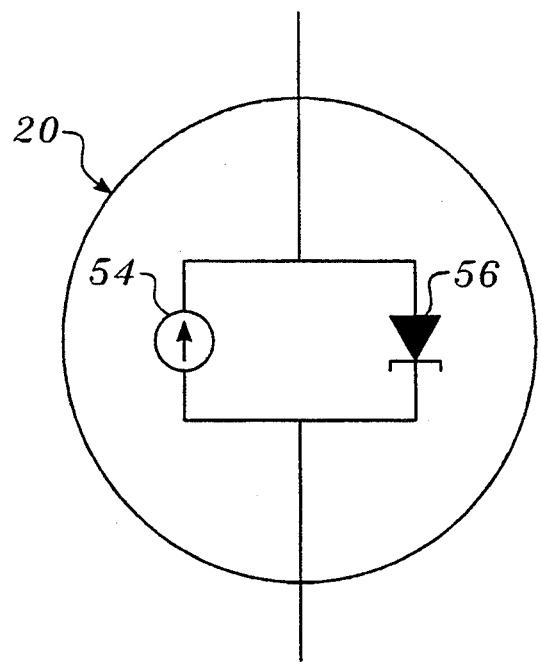
FIG. 3.
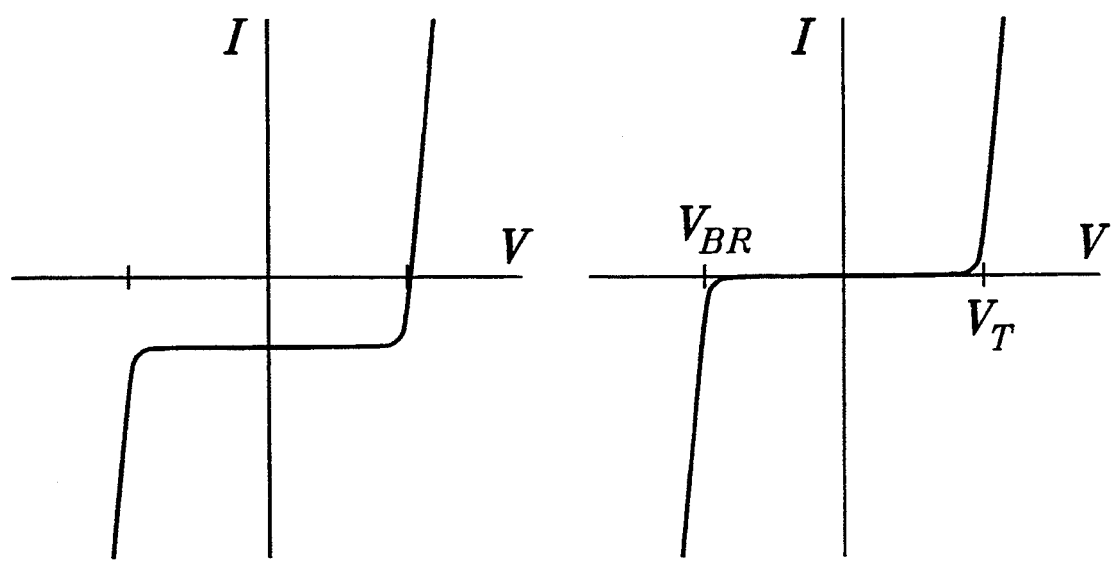
FIG. 4A.   FIG. 4B.

LOW BANDGAP PHOTOVOLTAIC CELL WITH INHERENT BYPASS DIODE

This application is continuation-in-part application of U.S. patent application 07/840,509, filed Jun. 19, 1991 now U.S. Pat. No. 5,248,346; which was a continuation-in-part application of Application 07/717,635, filed Jun. 19, 1991, now U.S. Pat. No. 5,123,968; which was a divisional application of Application 07/523,710, filed May 19, 1990, now U.S. Pat. No. 5,091,018; which was a continuation-in-part application of Application 339,311, filed Apr. 17, 1989, now abandoned. Application 07/717,635 is also a continuation-in-part application of Application 07/527,061, filed May 21, 1990, now U.S. Pat. No. 5,096,505; Application 07/527,038, filed May 21, 1990, now U.S. Pat. No. 5,118,361; and Application 07/755,316, filed Sept. 5, 1991, now U.S. Pat. No. 5,217,539. Each of these applications or patents is incorporated by reference.

FIELD OF THE INVENTION

This application relates to III-V photovoltaic cells and, more particularly, to a GaSb photovoltaic cell with an inherent bypass diode.

BACKGROUND OF THE INVENTION

A photovoltaic (PV) cell is a semiconductor transducer for converting electromagnetic radiation, particularly radiation in the visible or near visible (especially the infrared) portion of the spectrum into electrical energy. PV cells can be used as sensors in cameras and the like to obtain an electrical signal or to measure the incident or ambient light. They also can be used in power arrays to generate electrical power. PV cells are typically used to power electrical equipment for which it has otherwise proved difficult or inconvenient to provide a conventional source of continual electrical energy.

An individual PV cell has a distinct spectrum of light to which it is responsive as determined by the material forming the cell. Individual PV cells generate only a relatively small amount of power, for example, 0.5 to 3.0 watts. Consequently, for most power generation applications, multiple PV cells are connected together in series into an array. When using an array, a shadow or obstruction can temporarily or permanently cover one or more of its cells. These shaded cells do not receive light and are unable to generate power. Electrically a PV cell may be considered to be a current source in parallel with a diode that is forward biased relative to the current source. Problems arise in a series-connected PV cell array when an individual cell ceases to generate electricity because the diode characteristics of the inactive PV cell cause that cell to appear as a reverse-biased diode (i.e., an infinite or large resistor) to the other cells. The inactive cell blocks current flow and a large voltage develops across the cell. Consequently, the inactive PV cell, instead of functioning as a current source, functions as a power sink that can consume much of the energy produced by the remaining active PV cells in the array. The power output of the array falls dramatically. Moreover, the power consumed because of the inactive cell is converted into heat, which can easily damage that cell, surrounding cells, or the surrounding components. Exposure to large voltages for extended periods of time can cause the PV cell to break down permanently, resulting in an irreparable cell failure. In this case, even if the cell is later illuminated, it will continue to function as a resistor.

For example, a solar cell panel for space applications may require delivery of 29 V to a battery or load, calling for 28 series GaAs cells. If one cell were to fail from shading, as much as 27 V could be supplied in reverse bias across the shaded cell. A GaAs cell typically breaks down destructively in back bias at approximately 7 V because current is forced through local defects near the grid lines creating hot spots.

To prevent these problems, arrays customarily include a forward-biased diode (i.e., a bypass diode) connected in parallel across sets of one or more of the cells that form the array. Then, when one or more cells are inactive, current will flow around the cells through the bypass diodes, thereby eliminating the loss of power and the generation of heat otherwise occurring with the forward-biased diode of the inactive cell. While bypass diodes have proven a useful addition to arrays, they have their own disadvantages. Having to provide these diodes in addition to the cells adds to the overall cost and manufacturing complexity of any array. Furthermore, the addition of the diodes adds to both the weight and size of the cell array, which can be a significant disadvantage in space applications. Arrays that provide meaningful amounts of power for space applications have thousands or tens of thousands of PV cells, so the mass of a bypass diode for each cell becomes significant for launch cost and pointing and tracking following deployment. With the present invention, we avoid the need for separate, additional bypass diodes by constructing them into the booster cell of a tandem pair.

SUMMARY OF THE INVENTION

This invention relates to a PV cell that inherently includes a bypass diode, particularly a GaSb booster cell for a GaAs/GaSb tandem concentrator power array. The PV cell of this invention is constructed of semiconductor material that, in addition to developing an electrical potential when exposed to light, also functions as a bypass "tunneling" diode when a reverse voltage is applied. This effect occurs in PV cells made from semiconducting materials having relatively low bandgap energy levels of less than about 1.0 eV, particularly, in germanium, indium gallium arsenide, indium gallium arsenide phosphide, or gallium antimonide.

In a preferred embodiment, gallium antimonide (GaSb), which has a bandgap energy of approximately 0.72 eV, is doped with tellurium to create an n-region. The surface of the GaSb wafer is selectively counter-doped with zinc to create a p-region in opposition to the underlying n-region. With a sufficiently heavy doping of tellurium, the GaSb will inherently include a reverse-biased (bypass) diode so that the GaSb is particularly advantageous in the tandem GaAs/GaSb cells we contemplate. The bypass diode allows reverse current flow in the array with minimal resistance. The bypass diode is only a small resistor; it consumes negligible power, does not heat up significantly, and eliminates permanent cell break down.

A PV cell that includes a bypass diode is well suited for assembly in series with other PV cells to form a multicell array, especially an array of tandem cells. In a tandem, a first type of PV cell is stacked atop a second (booster) cell. The booster cell absorbs light at a different wavelength from that of the first cell; the first cell is transparent to the light which the booster cell absorbs. The first cells are connected together in series and are connected in parallel with the booster cells in the array circuit. In the event any PV cell in any tandem pair is rendered inactive, the booster cell of that pair will function as a bypass diode to allow reverse current flow. The array will still generate a significant amount of power as will be explained.

BRIEF DESCRIPTION OF THE DRAWINGS

FIG. 3 is a schematic drawing illustrating how the PV cell of this invention can be represented in electrical device circuitry.

FIG. 4A is a current-voltage (I-V) profile for the PV cell of this invention in the illuminated, active state.

FIG. 4B is a current-voltage profile of the PV cell of this invention in the shaded, inactive state.

DETAILED DESCRIPTION OF THE PREFERRED EMBODIMENT

Figure 1:
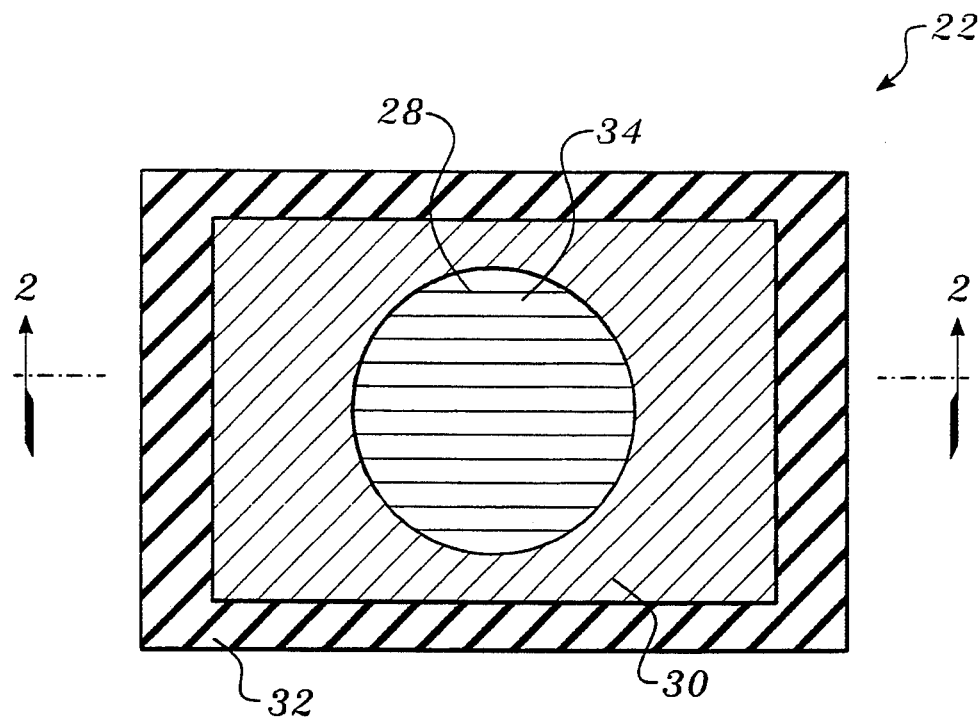
FIG. 1 is a plan view of a preferred photovoltaic cell of this invention.
Figure 2:
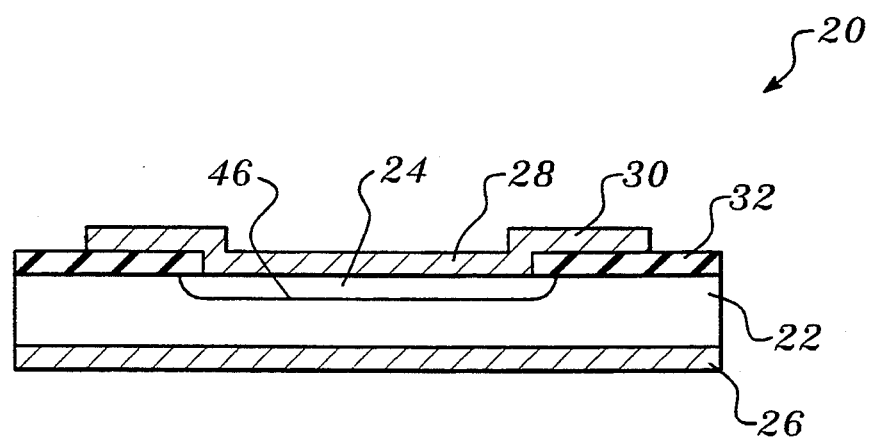
FIG. 2 is a sectional view of the PV cell of FIG. 1 taken generally along line 2—2.

FIGS. 1 and 2 illustrate PV cell 20 of the present invention that inherently includes a bypass diode. Cell 20 is typically formed of gallium antimonide (GaSb), a material with a low bandgap energy necessary to achieve significant tunneling current flow at reasonably low reverse biases. Higher bandgap materials would create excess power loss to trigger the bypass diode. The cell includes both an electron-emitting n-region 22 and an electron-accepting p-region 24. The n-region 22 is the largest portion of the photovoltaic cell 20; the p-region 24 occupies only a relatively small volume in the top portion of the n-region. The n-region 22 is formed by doping the basic GaSb structure with tellurium (Te), and the p-region 24 is formed by counterdoping the tellurium-doped structure with zinc. A metalized base 26 bonded to the underside of the n-region 22 functions as the negative terminal for the cell 20. Relatively narrow grid lines 28 that extend across the p-region 24 provide a conductive path so that electrons can flow into the p-region 24. The opposed ends of the grid lines 28 are attached to a wider bus conductor 30 located on the surface of the cell 20 that extends around the periphery of the p-region 24 and that functions as the positive terminal. Bus conductor 30 is separated from the underlying n-region 22 by an insulating mask 32, such as silicon nitride. An antireflective coating 34 that serves to maximize the amount of light the p-region 24 absorbs is located on top of the p-region 24 in the interstitial spaces between grid lines 28.

The process of fabricating the preferred GaSb booster cell 20 of this invention to create an inherent bypass diode is generally applicable to III-V diffused-junction PV cells and is described more completely in U.S. Pat. No. 5,217,539. Initially, a single crystal wafer of GaSb is doped to form the n-region so that it has a room-temperature carrier concentration of preferably greater than about $6 \times 10^{17}$ atoms/cm$^3$. In a particularly preferred embodiment of the invention, the GaSb wafer is doped with tellurium (Te) to a concentration of between $6 \times 10^{17} - 1 \times 10^{18}$ atoms/cm$^3$. As we will discuss in more detail, the usefulness of the tunneling effect to form an integral bypass diode is strongly dependent on the Te dopant concentration. Although the tunneling effect can be observed over the range from $3-5 \times 10^{17}$ atoms/cm$^3$, it is only commercially useful to form an integral bypass diode for GaSb cells with Te concentrations over $6 \times 10^{17}$ atoms/cm$^3$. In this $3-5 \times 10^{17}$ atoms/cm$^3$ range, the breakdown voltage of the bypass diode is more than twice that within the preferred range, so the power loss with the diode is higher than optimum. In fact, observing the bypass phenomena in the $3-6 \times 10^{17}$ atoms/cm$^3$ range may be difficult. In our early tests, we failed to appreciate this fact, so in our article: L. Fraas et al., "Over 35% Efficient GaAs/GaSb Tandem Solar Cells, IEEE Transactions in Electrons Devices, vol. 37, no. 2, (February 1990), we included separate bypass diodes in keeping with conventional design, although the booster cells were doped to a concentration of $4 \times 10^{17}$ atoms/cm$^3$.

After the wafer is doped to form the n-region, the insulation mask is formed by initially applying an insulating layer because it is a good dielectric and can prevent oxidation of the underlying n-doped region of the solar cell, can withstand the subsequent thermal cycling of the cell that otherwise occurs during the later manufacturing steps, and serves as a barrier against unwanted zinc diffusion that occurs during the p-doping steps described below. The silicon nitride usually is applied to the wafer to thickness of about 0.1 micron.

The insulating layer is etched using standard photolithography techniques to form an opening exposing a portion of the GaSb wafer. A layer of photoresist may be deposited in a pattern on the insulating layer. Thereafter, the photoresist is developed to selectively remove the insulating layer to define both the insulation mask and the adjacent opening. Preferably, the insulating layer is selectively removed to form a circular opening that has a diameter between 4 and 9 millimeters, and typically one with a diameter between 5 and 6 millimeters. After the opening is formed, a p-type dopant, such as zinc, is diffused into the exposed surface of the GaSb wafer to serve as a conductivity-type modifier to form a first emitter region that is part of the p-region that has a surface area equal to that of the opening and a thickness of approximately 0.1 micrometer so that the zinc concentration in the first emitter region is between approximately $10^{20}$ and $10^{21}$ atoms/cm$^3$. The diffusion step may be accomplished by using a quasi-closed graphite box in a conventional manner. The box has a molten zinc-gallium source. The molten zinc source provides a source of p-type dopant atoms, which diffuse through the opening into the lattice of the n-doped wafer. The concentration versus depth into the wafer of the zinc dopant atoms is a function of time and temperature.

After the initial zinc diffusion step, a second zinc diffusion step is performed in the vicinity where grid lines 28 will be deposited. This process starts with the application of a second silicon nitride layer to the surface of the wafer. In addition to covering the initially applied insulation mask, the second silicon nitride layer also covers the opening defined by the perimeter of the insulation mask. After the second silicon nitride layer is applied, it is selectively developed to form openings above the first emitter region to define the spaces for the grid lines. The wafer is then subjected to a second diffusion process to introduce zinc dopant into the previously formed first emitter region in the vicinity of the openings. This diffusion causes the formation of a set of zinc-concentrated second emitter regions that extend downward regions that have a profile of vertically oriented rectangles that have rounded corners and that are laterally centered around the openings with which they are associated. These second emitter regions are each approximately 1.0 thick. Collectively, the circular emitter region from the first diffusion and the second emitter regions form p-region 24 to define a single pn-junction 48 with n-region 22 (FIG. 2).

As a consequence of the zinc diffusion process, an unwanted zinc-diffused region forms on the backside of the wafer. The backside thereafter is etched to remove the unwanted zinc diffusion layer. The base contact 26 is then formed on the backside of the wafer. The base contact must have a low electrical resistance, adhere to the lower surface of the wafer, and meet the other requirements for use in space or terrestrial applications. The base contact is typically formed of two or more different layers of different metals and/or metal alloys. One base contact is, for example, formed of a gold-tin inner layer adjacent the n-region, an intermediate platinum layer, and an outer layer formed of gold that serves as a bonding area. The gold-tin alloy of the inner layer adheres well to the wafer. The pure gold of the outer layer forms a surface to which electrical conductors can easily be bonded. The platinum of the intermediate layer serves as a barrier that prevents the tin from diffusing into the outer layer. In another embodiment of the invention, base contact 26 is formed with an indium-tin oxide (ITO) layer adjacent the wafer and an outer layer formed of silver.

After formation of the base contact 26, grid lines 28 and the bus conductor 30 are formed. Initially, a thin layer of photoresist (not illustrated) is applied to the top of the wafer. The photoresist is then selectively developed to define openings that correspond to the pattern of the grid lines 28 and the bus connector 30. In practice, the openings in the photoresist that define the grid lines 28 are slightly wider than the underlying openings in the second silicon nitride layer. For example, openings in the second silicon nitride layer may be approximately 6.0 micrometers in width and the corresponding openings in the photoresist may be approximately 8.0 micrometers in width. A layer of metal forming the grid lines 28 and the bus conductor 30 is then disposed over the top surface of the wafer. The remaining photoresist is then stripped from the surface of the wafer to form the grid lines 28 and bus conductor 30. In a preferred embodiment, the metal forming the grid lines 28 and bus conductor 30 comprises a layer of palladium under a layer of gold. At the completion of processing, the thickness of the grid lines 28 and the bus conductor 30 may be approximately 2.0 micrometers.

The second silicon nitride layer of this photovoltaic cell serves three functions. The portion of this silicon nitride layer that overlies the insulation mask serves as part of the insulation mask. During the manufacture of the PV cell, the portion of the second silicon nitride layer that overlies the p-region serves as the diffusion mask to allow the selective formation of the second emitter regions. After manufacture of the PV cell, the portion of the second silicon nitride layer that overlies the p-region functions as the antireflective coating 34 (FIG. 1) to maximize the amount of light absorbed by the cell.

Since the openings in the photoresist through which the grid lines 28 were formed are normally wider than the underlying openings in the second silicon nitride layer, the grid lines are formed with flanges that extend slightly over the underlying second silicon nitride layer to increase the mechanical bonding of the metal forming the grid lines to the surface of the photovoltaic cell.

PV cell 20 performs two functions, as depicted schematically by FIG. 3. When the cell 20 is active, photons of light energy strike the cell and excite electrons in valence orbitals around the GaSb to enter higher, conduction band orbits. This forms holes in the lower energy valence band orbitals. The electrons are free to move between conduction band orbitals of the GaSb;- the holes are able to move freely between the valence band orbitals. This displacement of free charges causes a voltage difference between the n-region 22 and the p-region 24 wherein the p-region is electron poor or more positive. When a load is connected across the two regions, the current flows from the p-region 24, through the load, to the n-region 22 as represented by current source symbol 54.

When the PV cell 20 is not exposed to light energy, the electrons are not excited to the valence orbitals. With no holes, no voltage difference develops. In this state, the cell 20 is inactive. Because the cell 20 has a relatively low bandgap energy, a relatively small reverse current applied to the n-region 22 will excite the electrons to the point where they will move from valence band orbitals to the higher conduction band orbitals. Consequently, electrons are able to travel between the conduction band orbitals of the GaSb so that the cell 20 functions as a tunneling bypass diode 56, represented by the symbol for a backward diode, in that, once a particular back-bias voltage breakdown level is reached, the cell allows current flow. This breakdown is nondestructive; it does not serve to permanently damage the semiconducting material forming the PV cell 20. Because the cell 20 functions as its own bypass diode, it eliminates the need either to connect a discrete bypass diode across the cell 20 or to fabricate a separate bypass diode on the semiconductor on which the cell is formed, as we did in the modules we tested and described in our 1990 paper and others typically did. By functioning as a bypass diode, the cell 20 simplifies the array circuitry, simplifies the manufacturing process, and reduces the array mass. The benefits are particularly beneficial to a technology where the unit cost of power is determinative of the commercial success or failure.

Mathematically, the tunneling current flow, J, across the pn-junction 48 can be expressed as:

$$J = A(N^{0.5}/V_g^{0.5})V(V_g-V)^{0.5}\exp\{-B\ V_g^{1.5}/[N^{0.5}(V_g-V)^{0.5}]\}$$

where A and B are constants, N is the n-dopant concentration, $V_g$ the bandgap energy level of the semiconducting material; and V the voltage across the junction. This formula is based upon the principle that the tunneling current across a pn-junction is a function of both the electric field across the junction and the bandgap energy. The electric field across the junction is a function of the difference between the built-in potential of the semiconducting material and the voltage across the semiconducting material and is further inversely proportional to the width of the depletion layer. For the semiconducting material forming a PV cell, the width of the depletion layer is generally inversely proportional to the concentration of n-dopants or p-dopants, whichever is lower, in the semiconducting material.

For example, depending on the n-dopant concentration, a cell of sufficiently low bandgap can be fabricated to include or not include an inherent bypass diode. When an InGaAs wafer is fabricated, it typically has an inherent p-dopant concentration of approximately $10^{15}$ atoms/cm$^3$. The wafer is then subjected to a first doping to form the n-region. If the final cell is not intended to function as its own bypass diode, InGaAs will be doped with only a relatively small amount of n-dopant, for example, approximately $5 \times 10^{16}$ atoms/cm$^3$ Te. If the photovoltaic cell is intended to function as its own bypass diode, the wafer will instead be doped with an order of magnitude higher concentration of n-dopant, for example, approximately, $5 \times 10^{17}$/cm$^3$. After the wafer is n-doped, it is subjected to a counterdoping to form a p-region so that the wafer will serve as a photovoltaic cell. Zinc, or other p-dopant, is introduced into the wafer to form a p-region. The concentration of p-dopant is typically in the range of $10^{19}$ to $10^{20}$ atoms/cm$^3$.

The extra n-dopant added to the InGaAs wafer to form the bypass diode reduces the width of the depletion layer, the region in which the charge-carrier density is insufficient to neutralize the fixed density of donors and acceptors. The minimization of the depletion zone serves to increase the strength of the electric field that forms at the pn-junction. The increase in field strength, in combination with the relatively low bandgap energy of the semiconducting material, minimizes the reverse-biased potential that needs to be applied to the PV cell to cause substantive current flow. In other words, since the pn-junction of the PV cell has a relatively small depletion zone, and requires the application of a relative small amount of energy to excite the electrons into conduction band orbits, the cell has a relatively low reverse-bias breakdown voltage.

FIGS. 4A and 4B graphically depict the current-voltage (I-V) profile for cell 20 for illuminated and nonilluminated (shaded) states, respectively. As depicted by FIG. 4A, when PV cell 20 is illuminated and active, it has forward voltage. The p-region 24, the anode of the cell, has a greater potential than n-region 22, the cathode of the cell. At the same time, the cell 20 initially has a reverse, or negative, current in that current flow out of the cell through a load connected across the cell is from the p-region 24 through the load and back to the n-region 22. In other words, in comparison to passive electrical components, photovoltaic cell 20, when illuminated, instead of consuming power, functions as a power generator. At relatively low forward voltages, photovoltaic cell 20 emits a generally constant current. As the forward voltage across cell 20 increases, the reverse current starts to fall. Once a forward breakdown voltage is reached, current flow through cell 20 changes direction and becomes a forward current, from the n-region 22, through the load and to the p-region 24. The cell 20 thus ceases to be a current source and starts to function as a current sink.

When cell 20 is shaded and is rendered inactive, it functions as a tunneling diode, illustrated by FIG. 4B. At forward and reverse voltages near zero, there is nominal current flow into the cell. Once voltages greater than the forward-bias breakdown voltage $V_T$ or reverse-bias breakdown voltage $V_{BR}$ is exceeded, there is significant current flow through the cell 20. Since the reverse voltage across cell 20 and reverse current flowing through the cell are occurring simultaneously, the cell in this state is functioning as a power consumer. However, since there is only a small reverse voltage across cell 20, the actual amount of power consumed by the cell is generally relatively nominal. Depending on the Te concentration of the n-region 22, a GaSb cell 20 of this invention has been found to have a reverse breakdown voltage typically of between 0.4 and 1.2 volts. In general, an increase in Te concentration causes a decrease in the reverse breakdown voltage. The paper "Fundamental Characterization Studies of GaSb Solar Cells," by L. Fraas et al., IEEE 22d Conf. on PV Solar Cells (Las Vegas, October 1991) incorporated by reference, discloses the current-voltage characteristics for GaSb photovoltaic cells doped with various concentrations of tellurium.

For GaSb cells, our experiments have shown that the equation for tunneling current flow accurately describes the breakdown voltage dependence on Te doping, N. For example, for a current density of 5 Amp/cm$^2$ and $N = 6.4 \times 10^{17}$ atoms/cm$^3$, the breakdown voltage is found to be $-0.7$ V. When N is decreased to $4 \times 10^{17}$ atoms/cm$^3$, the breakdown voltage more than doubles to $-1.6$ V. Thus the power drop for $N = 4 \times 10^{17}$ atoms/cm$^3$ is more than twice as high as that for $N = 6 \times 10^{17}$ atoms/cm$^3$. This is consistent with our earlier statement that for GaSb cells, the commercially useful Te doping range for an inherent bypass diode/photovoltaic device is N greater than $6 \times 10^{17}$ atoms/cm$^3$. Because the power loss is such a strong function of the doping concentration and achieving higher doping levels is easy to do without introducing any adverse consequences, we prefer to dope the GaSb to Te concentrations of at least $6 \times 10^{17}$ atoms/cm$^3$ Te.

Generally, both the n-dopant and p-dopant concentrations are equal to or greater than about $6 \times 10^{17}$ atoms/cm$^3$, so that the application of a back-biased reverse-breakdown voltage across the semiconducting material allows current flow through the pn-junction when the reverse-breakdown voltage is between about $-1.5$ and $-0.5$ volts.

Figure 5:
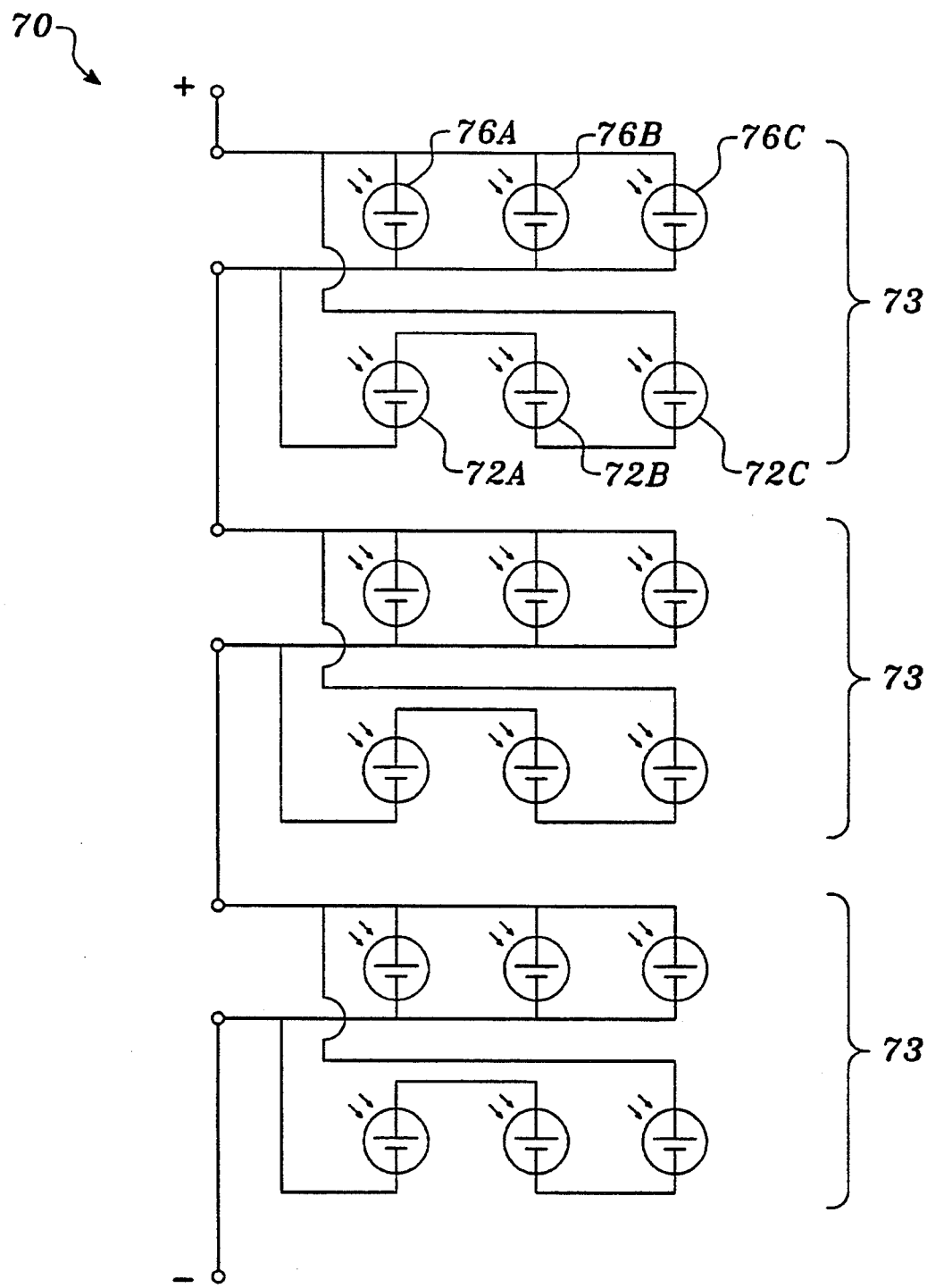
FIG. 5 is a schematic representation of a multicell power array using the PV cell of this invention.

FIG. 5 is a schematic diagram of an array 70 using GaSb solar cells 72a, 72b, and 72c. The array 70 consists of a number of series-connected subarrays 73, three subarrays belong shown. Array 70 is typically provided with a sufficient number of subarrays 73 so that for the application for which it is designed it can be approximately considered a constant current source. Each subarray 73 consists of three GaSb cells 72a, 72b, and 72c and three gallium arsenide (GaAs) cells 76a, 76b, and 76c, respectively, each of which is paired with a separate one of the GaSb cells. Each GaAs/GaSb cell pair is arranged in a tandem configuration such that the GaAs cell 76a is located on top of the associated GaSb cell 72a. The GaAs cells 76 have a relatively high bandgap energy and as such do not function as tunneling diodes. The GaAs cells 76a, 76b, and 76c are transparent to the light that is absorbed and converted into energy by the underlying GaSb cells 20. Specifically, the GaSb cells 20 are sensitive to photons having infrared wavelengths (wavelengths between 900 and 1800 nm); the GaAs cells 76 are transparent to light at these wavelengths. In each subarray 74, the GaSb cells 72 collectively serve as booster cells to increase the power generated by the GaAs cells 76. The applications and patents incorporated by reference disclose physical structures for tandem mounting the GaAs cells 76 and the GaSb cells 72. As discussed in those disclosures, each tandem pair of cells may be disposed on a flexible carrier formed of a polyimide tape. Conductors that connect the individual solar cells 72 and 76 together are disposed on the tape.

Under illumination, each GaAs cell 76 of each subarrays 73 produces a 0.35-amp current at a 1.14-volt potential. Since the GaAs cells 76 are connected in parallel, collectively the cells produce a combined current of 1.05 amps at 1.14 volts. The GaSb cells 72 each produce current of 0.25 amp at a 0.45-volt potential. Collectively, the series-connected GaSb cells 72 produce a current of 0.25 amps at 1.35 volts. Since the GaSb cells 72 produce the larger voltage, the output voltage of the subarray 73 is limited by the GaAs cells 76 to 1.14 volts. The current of the subarray 73 when illuminated is 1.3 amps, the sum of the current produced by the parallel-connected GaAs cells 76 and the series-connected GaSb cells 20.

Figure 6:
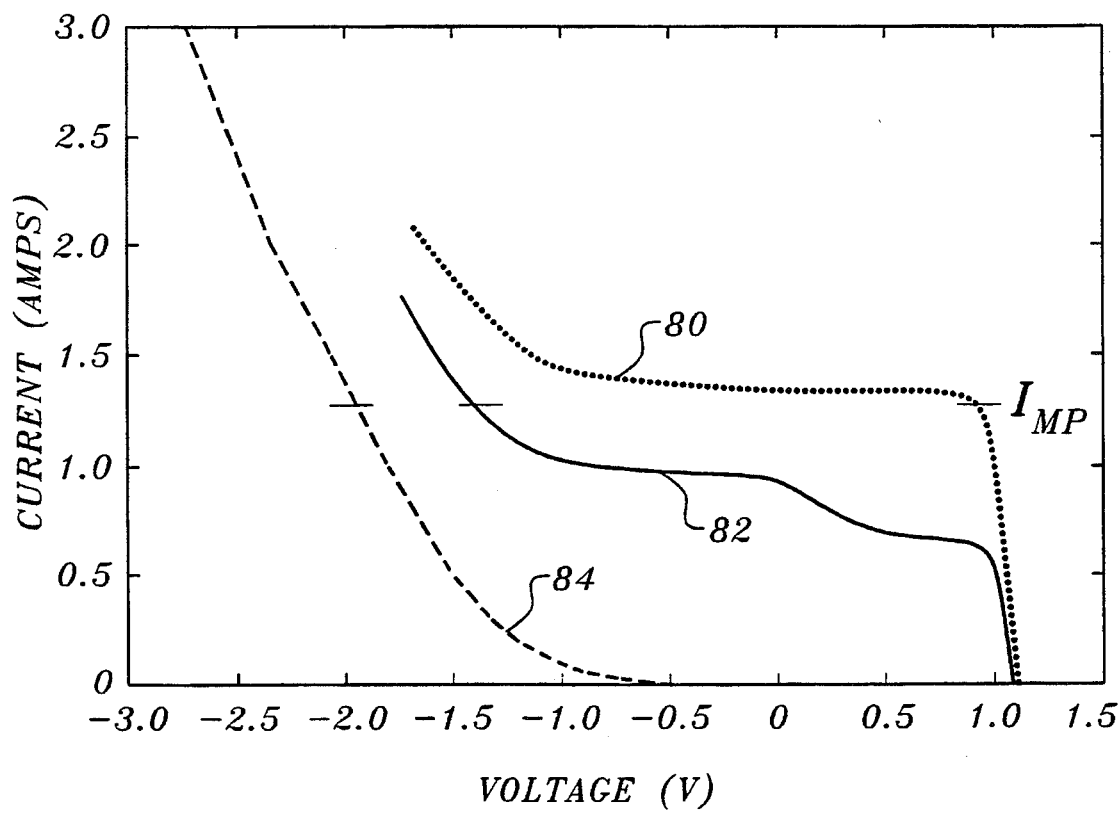
FIG. 6 is a graph of measured current-voltage (I-V) characteristics of one subarray of the multicell power array of FIG. 5.

FIG. 6 depicts the current-voltage (I-V) characteristics for various active/inactive states of an individual subarray 73 when constant voltages are applied across the subarray. Dotted curve 80 represents the I-V characteristics of the subarray 73 when each of the GaAs/GaSb cell pairs is fully illuminated. In this situation, when nominal voltages are applied across the subarray, the current flow is relatively constant, approximately 1.3 amps. The application of positive voltages greater than approximately 1.0 volt results in a decay of the negative terminal-to-positive terminal current flow through the subarray. The application of voltages greater than approximately 1.14 volts, the output potential of the active GaAs cells 76, across the subarray 73 causes current flow to drop to zero. The application of larger voltages across the subarray 73 causes the current to flow from the positive terminal through the cells to the negative terminal. In other words, once a voltage greater than 1.14 volts is applied across the subarray 73 it becomes a power sink. The subarray 73 similarly functions as a power sink whenever a negative voltage is applied.

When one of the tandem GaAs/GaSb cell pairs is shaded, the individual cells, for example, cells 72c and 76c, those cells cease generating a current. The characteristics of the subarray 73 in this state are represented by solid line 82. The shaded GaAs cell 76c is effectively disconnected from the circuit, since it is parallel connected to the associated GaAs cells 76a and 76b so that the current continues to flow through those, still active, cells. Upon deactivation, the shaded GaSb cell 72c acts as a reverse-biased diode with respect to the other components forming the subarray 73. When voltages greater than 0.5 volt are applied across the subarray, it loses the current from the remaining active GaSb cells 72a and 72b. For example, when 0.7 volt is applied across the subarray 73, the remaining active GaSb cells 72a and 72b continue to generate a combined voltage of 0.9 volt. Consequently, in this situation, to maintain an equalization with the 0.7 volt applied across the GaSb cell string, a −0.2 volt, or reverse-bias voltage develops across the inactive cell 72c. There is only nominal current flow through the GaSb cell string as represented by the relatively large current difference between the array fully illuminated and one-cell-shaded states. However, once a voltage of less the 0.5 volt is applied across the subarray 73, the inactive GaSb cell 72c begins to breakdown to allow substantial current flow. For example, when a voltage of 0.1 volt is applied across the partially shaded subarray, the still active GaSb cells will continue to produce a 0.9-volt potential to maintain equalization with the voltage across the subarray 73, a −0.8-volt back-bias voltage develops across the inactive GaSb cell 72c. At this voltage level, the semiconducting material forming the cell has undergone a nondestructive breakdown to allow current flow therethrough. The current produced by the other, still active, GaSb cells 72a and 72b flows through the inactive cell 72c to cause a rise in the current out of the cell. This is represented by the smaller current difference between the array fully illuminated and one-cell-shaded states at the 0.1-volt level as opposed to that at the 0.7-volt level.

Only a relatively small voltage drop occurs across the inactive GaSb cell 72c. In other words, the inherent bypass diode of the GaSb cell 72 of this invention prevents large, potentially destructive, voltages from developing across the GaAs cells with which it is associated. It should be understood that the GaSb cell of this invention functions as a bypass diode to allow current flow even if just one of the solar cells 72c or 76c forming the tandem pair is rendered inactive.

Dotted line 84 of FIG. 6 represents the I-V characteristics of the subarray 73 when all the cells are shaded. When forward-biased voltages are applied to the cell there is no current flow through the subarray 73. When back-bias voltages less than −0.5 volt are applied to the subarray 73, the GaSb cells start to nondestructively break down to start to allow current flow. At back-bias voltages near 1.5 volts, substantive current starts to flow through the inactive GaSb cells 72. At back-bias voltages less than −2.2 volts the GaSb cells 72 have essentially gone through a complete nondestructive breakdown and the current flow through the subarray 73 approaches the current flow that occurs when it is in the fully active state. Consequently, if an entire subarray 73 is rendered inactive, it does not appreciably consume a large portion of the power developed by the remaining, active components of the array 70. This invention eliminates the need to provide a bypass diode across the individual subarrays to minimize the power loss of the array 70 when one of the subarrays is rendered inactive.

A cell of this invention can be connected in series with a constant current source capable of generating significant potential. When cell 20 is active, it will develop a voltage that can be used to produce a current through the associated load. When the photovoltaic cell is inactive, it will function as a tunneling diode so that the voltage developed by the current source can be placed across the load to develop a current flow.

Further discussion of our experimental results is contained in the article: Fraas et al., "Tandem Gallium Solar Cell Voltage-Matched Circuit Performance Projections," *Solar Cells*, 30 (May 1991) 355–361, which is incorporated by reference.

The foregoing description has been limited to a specific GaSb cell and a specific array. It will be apparent, however, that variations and modifications can be made to the invention with the attainment of some or all of the advantages thereof. For example, the invention includes photovoltaic cells formed from material having a bandgap voltage of less than approximately 1.0 eV and, preferably, less than 0.8 eV. Semiconducting materials that fall in this range include indim gallium antimonide ($In_xGa_{(1-x)}Sb$), germanium (Ge), indium gallium arsenide ($In_xGa_{(1-x)}As$), and indium gallium arsenide phosphide ($In_xGa_{(1-x)}As_yP_{(1-y)}$) wherein both x and y are selected from the range 0 to 1.0. It may also be possible to fabricate the PV cell 20 of this invention out of copper indium diselenide ($CuInSe_2$), which has a bandgap energy level of approximately 1.0 eV. In some of these cells, the reverse breakdown voltage may approach 3.0 volts or more. Ideally though, the breakdown voltage should be less than 2.0 volts and more ideally less than 1.0 volt. In some situations it may be desirable to fabricate the photovoltaic cell so that it will breakdown with the application of a breakdown voltage as little as 0.3 volts. Also, with regard to the dopant concentrations discussed it should also be understood that they are similarly illustrative and not to be considered limiting. The necessary dopant concentrations can be calculated for a particular material using the tunneling current flow equation. Moreover, while the array 70 incorporates not only the PV cells 20 of this invention but other photovoltaic cells, other arrays in which the PV cells are employed need not include conventional photovoltaic cells. In other versions of the invention, the cells 20 of this invention may simply be strung together in series, without any other type of PV cells, to generate an output having selected voltage and amperage characteristics. In still other versions of this invention, it may be desirable to connect the PV cells of this invention to other power sources, such as batteries, to be able to take advantage of their characteristics of being able to both generate power and to serve as their own bypass diodes.

While a GaSb cell is sensitive to one specific spectrum of light energy emitted by sun, the invention is not similarly limited. Other PV cells having bypass diodes can be constructed that are sensitive to other wavelengths of light emitted by the sun. Moreover, still other versions of the invention can be constructed that are sensitive to light waves emitted by other light-generating sources. For example, some versions of the invention may be constructed to be sensitive to the light emitted by coherent light sources, such as lasers, while still other versions may be sensitive to the light emitted by glowing thermal sources, such as superheated tungsten rods.

Furthermore, it should similarly be understood that the disclosed method of manufacturing the PV cell 20 is illustrative and not limiting. In some methods of manufacture it may be desirable, for example, to initially fabricate the cells so that the p-region 24 is initially relatively thick and then to etch it back to reduce its overall size. It may also be desirable to provide a conductive grid radically different from that which is shown. Therefore, it is an object of the appended claims to cover all such modifications and variations as come within the true spirit and scope of the invention. While a preferred embodiment of the invention has been shown and described, it will be appreciated that various changes can be made to the preferred embodiment without departing from the spirit and scope of the invention.

We claim:

1. A photovoltaic cell formed of semiconducting material having a bandgap energy level, an n-region formed with an n-type dopant, and a p-region formed with a p-type dopant adjacent the n-region to form a single pn-junction; wherein the semiconducting material bandgap energy level is less than 1.0 eV and both n-dopant and p-dopant concentrations are equal to or greater than about $6 \times 10^{17}$ atoms/cm$^3$, so that the application of a back-biased reverse-breakdown voltage across the semiconducting material allows current flow through the pn-junction when the reverse-breakdown voltage is between about $-1.5$ and $-0.5$ volts.

2. A photovoltaic power array comprising a plurality of the cells of claim 1 connected in series.

3. The cell of claim 1 wherein the semiconducting material is selected from the group consisting of GaSb, $In_xGa_{(1-x)}Sb$, Ge, $In_xGa_{(1-x)}As$, $In_xGa_{(1-x)}As_yP_{(1-y)}$, and CuInSe$_2$, wherein both x and y are selected from the range of 0–1.0.

4. A photovoltaic power array comprising a module containing three tandem solar cells, each tandem solar cell including a GaAs primary cell and a GaSb booster cell having a pn-junction and being optically aligned beneath the GaAs cell to receive incident radiation transmitted through the GaAs cell, wherein in each tandem solar cell the GaAs cell is electrically connected in parallel with the GaSb cell, wherein in the module the respective GaAs cells and GaSb cells of the three tandem solar cells are connected electrically in series, and wherein each GaSb cell is doped with Te to a concentration in the p-region of at least about $6 \times 10^{17}$ atoms/cm$^3$ to form an n-region of the pn-junction so that the nondestructive, reverse-breakdown voltage at which the GaSb cell functions as a bypass diode for the module is between about $-1.5$ and $-0.5$ volts.

* * * * *